United States Patent
Cho et al.

(10) Patent No.: US 12,127,444 B2
(45) Date of Patent: Oct. 22, 2024

(54) DISPLAY DEVICE AND METHOD FOR MANUFACTURING THE SAME

(71) Applicant: Samsung Display Co., Ltd., Yongin-Si (KR)

(72) Inventors: Sungwon Cho, Hwaseong-si (KR); Yu-Gwang Jeong, Anyang-si (KR); Daesoo Kim, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 97 days.

(21) Appl. No.: 17/317,695

(22) Filed: May 11, 2021

(65) Prior Publication Data

US 2022/0059630 A1    Feb. 24, 2022

(30) Foreign Application Priority Data

Aug. 18, 2020  (KR) .......................... 10-2020-0103455

(51) Int. Cl.
*H01L 27/32*        (2006.01)
*H01L 29/417*       (2006.01)
(Continued)

(52) U.S. Cl.
CPC ..... *H10K 59/123* (2023.02); *H01L 29/41733* (2013.01); *H10K 59/1213* (2023.02);
(Continued)

(58) Field of Classification Search
CPC ......... H01L 29/41733; H01L 29/41725; H01L 29/41766; H01L 27/1251; H01L 23/5226;
(Continued)

(56) References Cited

U.S. PATENT DOCUMENTS 6,028,325 A  *  2/2000  Yamazaki .......... H01L 29/66757
                                                       257/E21.507
6,331,476 B1 * 12/2001  Kawakita .............. H01L 29/458
                                                       257/E29.147
(Continued)

FOREIGN PATENT DOCUMENTS

CN      106684154 A  *  5/2017   ......... H01L 27/1222
CN      107359177 A  * 11/2017   ............. H10K 50/00
(Continued)

OTHER PUBLICATIONS

Machine translation, Wang, Chinese Pat. Pub. No. CN107359177A, translation date: Mar. 7, 2023, Espacenet, all pages. (Year: 2023).*
(Continued)

*Primary Examiner* — Victoria K. Hall
(74) *Attorney, Agent, or Firm* — Innovation Counsel LLP

(57) ABSTRACT

A display device includes a substrate, an active pattern disposed on the substrate, a gate electrode overlapping the active pattern, an inorganic insulation layer covering the active pattern, a source metal pattern and an etch-delaying pattern. The source metal pattern includes a first portion that is disposed on the inorganic insulation layer, and a second portion that passes through the inorganic insulation layer and electrically contacts the active pattern. The etch-delaying pattern is disposed between the active pattern and the first portion of the source metal pattern, contacts the second portion of the source metal pattern, and includes a different material from the inorganic insulation layer.

6 Claims, 17 Drawing Sheets

(51) Int. Cl.

| | | |
|---|---|---|
| *H01L 51/56* | (2006.01) | |
| *H10K 59/121* | (2023.01) | |
| *H10K 59/123* | (2023.01) | |
| *H10K 71/00* | (2023.01) | |
| *H10K 71/20* | (2023.01) | |
| *H01L 27/12* | (2006.01) | |
| *H10K 59/12* | (2023.01) | |
| *H10K 59/124* | (2023.01) | |
| *H10K 77/10* | (2023.01) | |
| *H10K 102/00* | (2023.01) | |

(52) U.S. Cl.
CPC .......... *H10K 71/00* (2023.02); *H10K 71/233* (2023.02); *H01L 27/1251* (2013.01); *H10K 59/1201* (2023.02); *H10K 59/124* (2023.02); *H10K 77/111* (2023.02); *H10K 2102/311* (2023.02)

(58) Field of Classification Search
CPC .......... H01L 23/5283; H01L 29/66757; H01L 29/786–78696; H01L 21/76897; H10K 59/121; H10K 59/1213; H10K 59/1216
USPC ........................................................ 257/774
See application file for complete search history.

(56) References Cited

U.S. PATENT DOCUMENTS

| | | | | |
|---|---|---|---|---|
| 2005/0260804 | A1* | 11/2005 | Kang | H01L 21/76804 438/164 |
| 2007/0148831 | A1* | 6/2007 | Nagata | H01L 29/458 257/E27.113 |
| 2008/0135849 | A1* | 6/2008 | Yamayoshi | H01L 29/458 257/E29.147 |
| 2009/0275176 | A1* | 11/2009 | Kang | H01L 27/124 438/618 |
| 2016/0307988 | A1* | 10/2016 | Kim | H01L 27/1225 |
| 2017/0033312 | A1* | 2/2017 | Kim | H10K 59/131 |
| 2018/0062105 | A1* | 3/2018 | Lius | H10K 59/1213 |
| 2019/0027612 | A1* | 1/2019 | Zhang | H01L 29/78678 |
| 2020/0066765 | A1* | 2/2020 | Cho | H01L 27/1251 |
| 2020/0105799 | A1* | 4/2020 | Yuan | H01L 27/124 |
| 2021/0104588 | A1* | 4/2021 | Han | H10K 71/00 |
| 2021/0143189 | A1* | 5/2021 | Kim | H01L 27/124 |
| 2021/0280613 | A1* | 9/2021 | Kwon | H01L 27/1255 |
| 2021/0296367 | A1* | 9/2021 | Seo | H01L 27/1225 |
| 2021/0384282 | A1* | 12/2021 | Tanaka | H01L 27/1225 |
| 2022/0005901 | A1* | 1/2022 | Tanaka | H01L 29/78618 |
| 2022/0165825 | A1* | 5/2022 | Seon | H10K 59/1213 |

FOREIGN PATENT DOCUMENTS

| | | | | | |
|---|---|---|---|---|---|
| JP | 2000286423 | A | * | 10/2000 | ....... H01L 21/76802 |
| JP | 2003007722 | A | * | 1/2003 | ........... H01L 21/336 |
| KR | 10-2014-0062800 | | * | 5/2014 | ......... H10K 59/1216 |
| KR | 10-2014-0062880 | | * | 5/2014 | ......... H10K 59/1216 |
| KR | 10-2016-0124979 | A | | 10/2016 | |
| KR | 10-2017-0080779 | A | | 7/2017 | |
| KR | 10-2019-0073848 | A | | 6/2019 | |
| KR | 10-2020-0087912 | A | * | 7/2020 | ......... H01L 27/1225 |

OTHER PUBLICATIONS

Machine translation, Park, Korean Pat. Pub. No. 10-1990554B1, translation date: Mar. 8, 2023, Espacenet, all pages. (Year: 2023).*

Machine translation, Suzuki, Chinese Pat. Pub. No. CN-106684154-A, translation date: Sep. 29, 2023, Clarivate Analytics, all pages. (Year: 2023).*

Machine translation, Kawakita, Japanese Pat. Pub. No. JP-2000286423-A, translation date: Sep. 29, 2023, Clarivate Analytics, all pages. (Year: 2023).*

Machine translation, Ishikawa, Japanese Pat. Pub. No. JP2003007722A, translation date: Jan. 18, 2024, Espacenet, all pages (Year: 2024).*

Machine translation, Kim, Korean Pat. Pub. No. KR20200087912A, translation date: Mar. 7, 2023, Espacenet, all pages. (Year: 2023).*

Machine translation, Park, Korean Pat. Pub. No. KR10-1990554B1, translation date: Mar. 8, 2023, Espacenet, all pages. (Year: 2023).*

\* cited by examiner

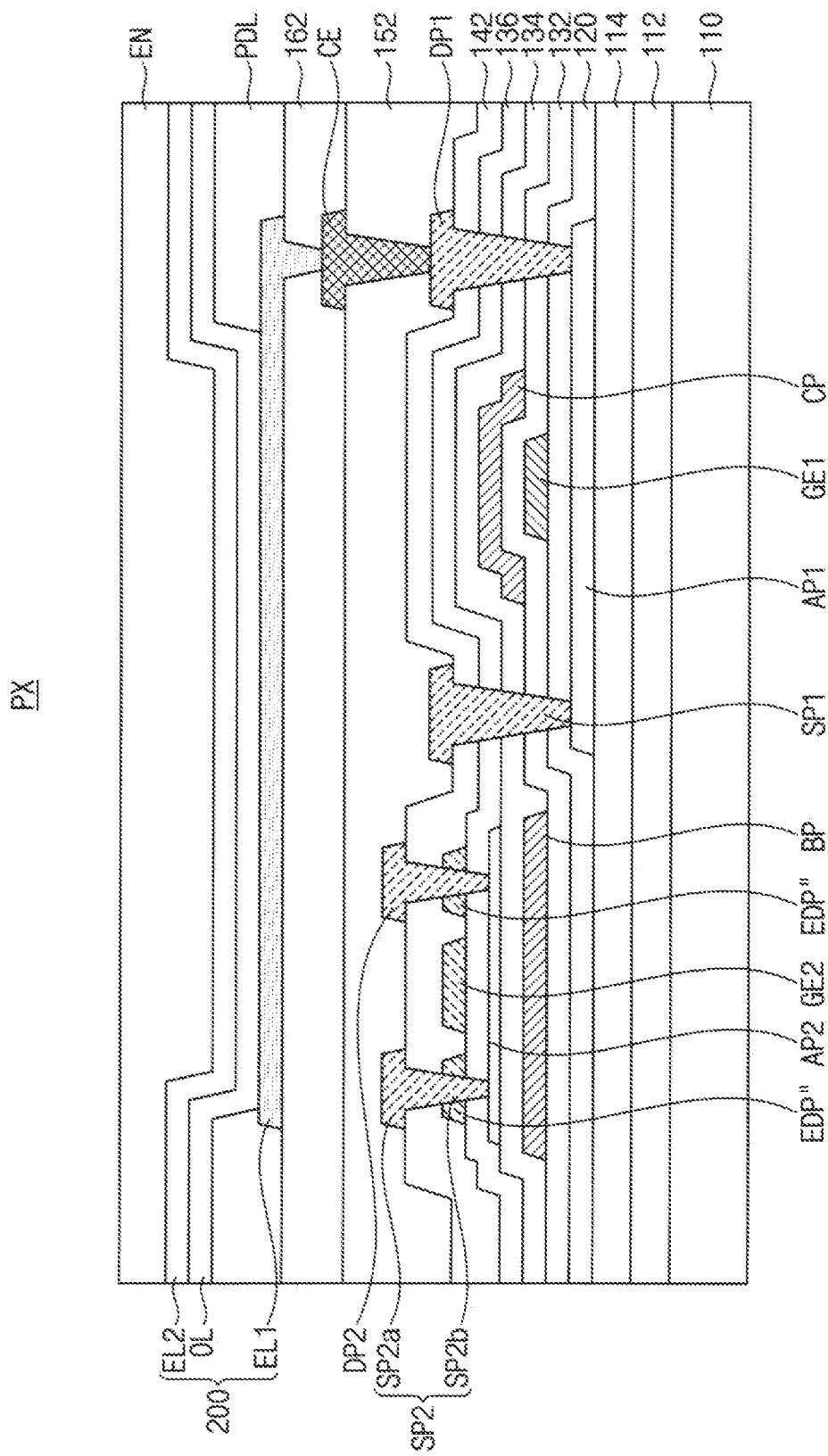

DISPLAY DEVICE AND METHOD FOR MANUFACTURING THE SAME

CROSS-REFERENCE TO RELATED APPLICATION

This application claims priority to and benefits of Korean Patent Application No. 10-2020-0103455 under 35 U.S.C. § 119 filed on Aug. 18, 2020 in the Korean Intellectual Property Office, the disclosure of which is incorporated herein by reference in its entirety.

BACKGROUND

1. Field

The present disclosure relates to a display device and a method for manufacturing a display device.

2. Description of the Related Art

An organic light-emitting display device may have superior characteristics as a display device compared to other types of display devices. For example, an organic light-emitting display device may display an image with a low power consumption without an additional light source, and may have a small thickness and a light weight.

A display panel of an organic light-emitting display device may include a flexible base substrate including a polymeric material. A display panel including a flexible base substrate may be designed to have a bending area. Inorganic layers in the display panel may be removed in the bending area to prevent a crack due to a bending stress applied in the bending area.

SUMMARY

The present disclosure provides a display device, which may be manufactured using smaller masks.

The present disclosure further provides a method for manufacturing the display device.

According to an embodiment, a display device includes a substrate, an active pattern disposed on the substrate, a gate electrode overlapping the active pattern, an inorganic insulation layer covering the active pattern, a source metal pattern and an etch-delaying pattern. The source metal pattern includes a first portion that is disposed on the inorganic insulation layer, and a second portion that passes through the inorganic insulation layer and electrically contacts the active pattern. The etch-delaying pattern is disposed between the active pattern and the first portion of the source metal pattern, contacts the second portion of the source metal pattern, and includes a different material from the inorganic insulation layer.

In an embodiment, the second portion of the source metal pattern may pass through the etch-delaying pattern.

In an embodiment, the etch-delaying pattern may include a metal.

In an embodiment, the etch-delaying pattern may include at least molybdenum.

In an embodiment, the etch-delaying pattern may be disposed in a same layer as the gate electrode.

In an embodiment, the display device may further include a capacitor electrode pattern that overlaps the gate electrode. The etch-delaying pattern may be disposed in a same layer as the capacitor electrode pattern.

In an embodiment, the active pattern may include silicon.

In an embodiment, the active pattern may include a metal oxide.

In an embodiment, the display device may further include an inorganic insulation layer that is disposed between the etch-delaying pattern and the first portion of the source metal pattern.

According to an embodiment, a method for manufacturing a display device is provided. According to the method, an active pattern is formed on a substrate. A lower inorganic layer is formed on the active pattern. An etch-delaying pattern is formed on the lower inorganic layer. The etch-delaying pattern overlaps the active pattern. An upper inorganic layer is formed on the etch-delaying pattern. A photoresist pattern including a first opening is formed on the upper inorganic layer. The first opening overlaps the etch-delaying pattern. The upper inorganic layer is removed in a first etching area that overlaps the first opening. The etch-delaying pattern is removed in the first etching area. The lower inorganic layer is removed in the first etching area to expose the active pattern.

In an embodiment, a source metal pattern that includes a first portion and a second portion may be formed. The first portion may be disposed on the upper inorganic layer, and the second portion may contact the active pattern.

In an embodiment, the upper inorganic layer and at least a portion of the etch-delaying pattern may be removed by a first dry-etching process.

In an embodiment, a remaining portion of the etch-delaying pattern may be removed by a wet-etching process.

In an embodiment, the lower inorganic layer may be removed by a second dry-etching process.

In an embodiment, a gate electrode may be formed on the lower inorganic layer. The gate electrode may overlap the active pattern.

In an embodiment, the etch-delaying pattern may be disposed in a same layer as the gate electrode.

In an embodiment, a capacitor electrode pattern that overlaps the gate electrode may be formed. The etch-delaying pattern may be disposed in a same layer as the capacitor electrode pattern.

In an embodiment, the photoresist pattern may further include a second opening that does not overlap the etch-delaying pattern. The upper inorganic layer and the lower inorganic layer in a second etching area and the upper inorganic layer in the first etching area may be removed simultaneously.

In an embodiment, the active pattern may include silicon.

In an embodiment, the active pattern may include a metal oxide.

According to the embodiments of the present disclosure, an etch-delaying pattern may be used when a plurality of areas are etched with different etching depths. Thus, a damage to an element disposed under the etch-delaying pattern may be prevented. Furthermore, the etching process (es) may be performed with a single mask so that a manufacturing efficiency may be increased.

BRIEF DESCRIPTION OF THE DRAWINGS

Aspects of one or more embodiments of the present inventive concept will be more clearly understood from the following detailed description taken in conjunction with the accompanying drawings.

FIG. 17, FIG. 18, FIG. 19, FIG. 20, FIG. 21, and FIG. 22 are cross-sectional views illustrating a method for manufacturing a display device according to an embodiment.

DETAILED DESCRIPTION

Display devices and methods for manufacturing a display device according to various embodiments of the present inventive concept will be described hereinafter with reference to the accompanying drawings, in which some embodiments are shown.

Figure 1:
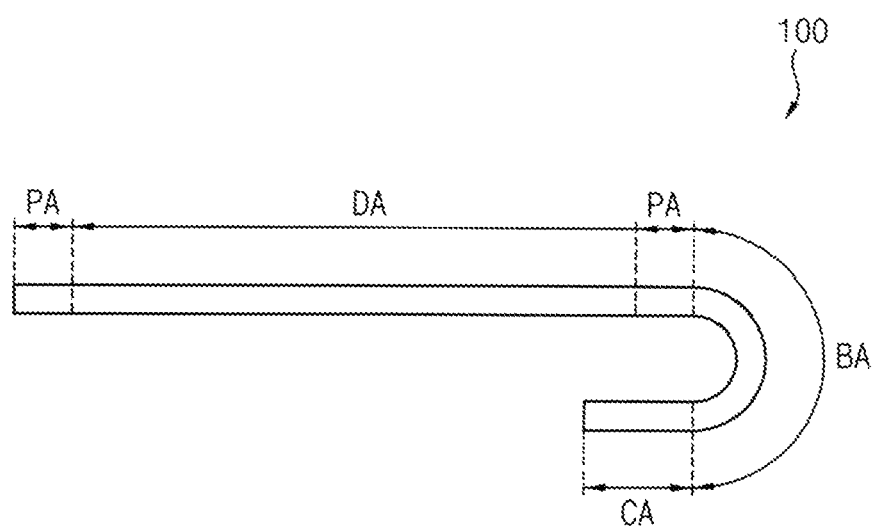
FIG. 1 is a cross-sectional view illustrating a display device according to an embodiment.
Figure 2:
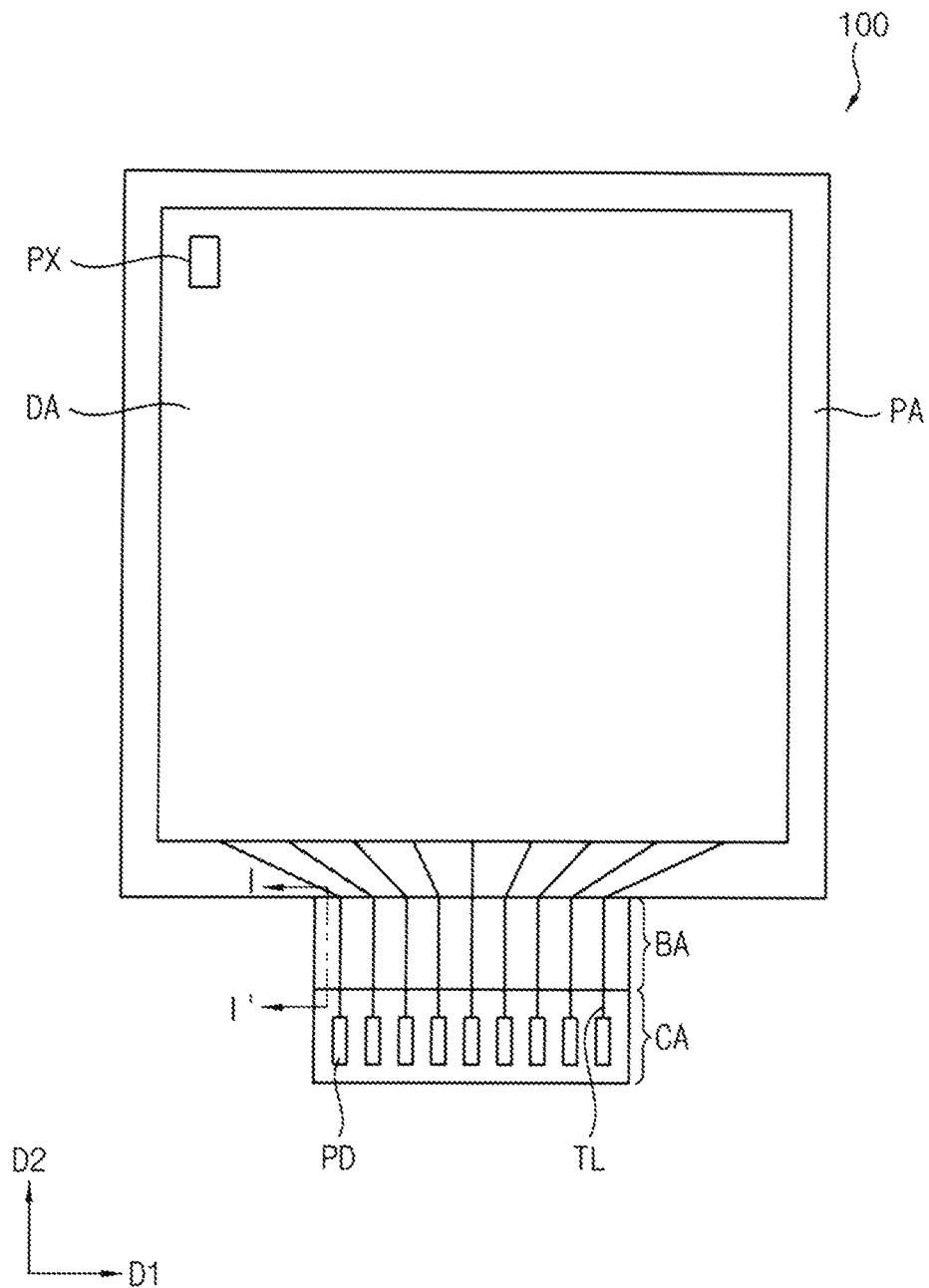
FIG. 2 is a plan view illustrating a display device according to an embodiment.

FIG. 1 is a cross-sectional view illustrating a display device according to an embodiment. FIG. 2 is a plan view illustrating a display device according to an embodiment. FIG. 2 may show an unfolded state of the display device to illustrate a bending area and a connection area in the plan view.

Referring to FIGS. 1 and 2, a display device 100 includes a display area DA and a peripheral area PA adjacent to the display area DA. The display area DA may include a plurality of pixel areas PX. In an embodiment, a light-emitting element and a driving element that is electrically connected to the light-emitting element may be disposed in each of the pixel areas PX. In a plan view, the peripheral area PA may surround at least a portion of the display area DA.

The display device 100 may further include a bending area BA and a connection area CA. The bending area BA may extend from a side of the peripheral area PA, and may bend downwardly. The connection area CA may extend from the bending area BA to be disposed under the display area DA and/or the peripheral area PA in a thickness direction of the display device 100. Referring to FIG. 2, in an unfolded state of the display device 100, the bending area BA may be disposed between the display area DA and the connection area CA.

The connection area CA may be electrically connected to a driving device (not shown). A plurality of connection pads PD may be disposed in the connection area CA. The connection pads PD may receive a driving signal or a power voltage from the driving device. The connection pads PD may be electrically connected to transfer wirings TL disposed in the bending area BA and the peripheral area PA. The transfer wirings TL may transfer the driving signal or the power voltage to the pixel areas PX in the display area DA. Furthermore, the transfer wirings TL may transfer the driving signal to a driving circuit (not shown) disposed in the peripheral area PA.

FIGS. 3, 4, 5, 6, 7, 8, 9, 10, 11, 12 and 13 are cross-sectional views illustrating a method for manufacturing a display device according to an embodiment. FIGS. 3, 5, 7, 8, 11 and 13 may illustrate a portion of a pixel area PX of the display device 100 shown in FIGS. 1 and 2. FIGS. 4, 6, 9, 10 and 12 may illustrate a cross-sectional view of the bending area BA of the display device 100 taken along the line I-I' of FIG. 2.

Figure 3:
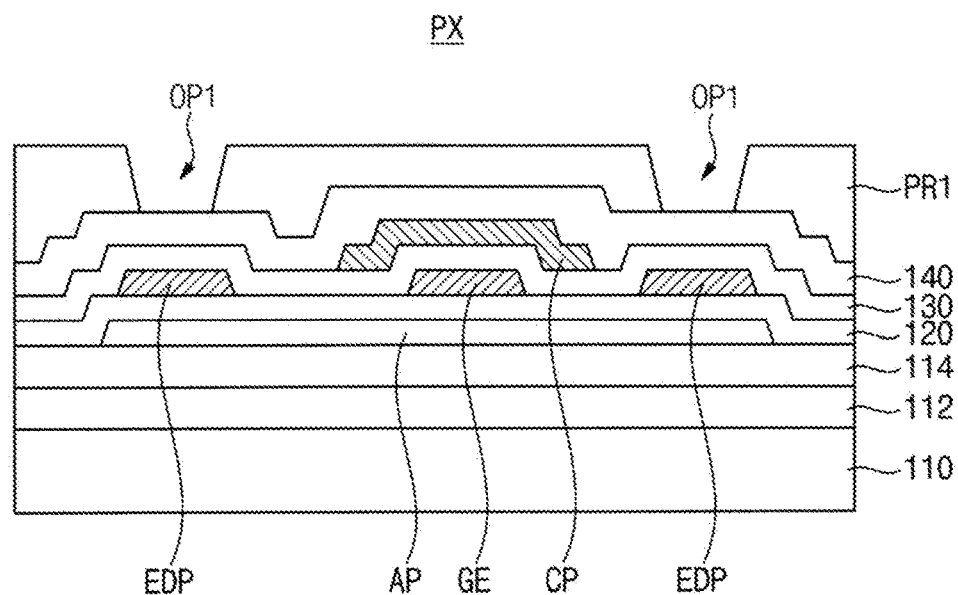
FIG. 3, FIG. 4, FIG. 5, FIG. 6, FIG. 7, FIG. 8, FIG. 9, FIG. 10, FIG. 11, FIG. 12, and FIG. 13 are cross-sectional views illustrating a method for manufacturing a display device according to an embodiment.

Referring to FIG. 3, a barrier layer 112 and a buffer layer 114 are formed on a base substrate 110 in the pixel area PX.

The base substrate 110 may include at least one polymer film. For example, the polymer film may include polyethylene terephthalate, polyethylene naphthalate, polyether ketone, polycarbonate, polyarylate, polyether sulfone, polyimide, or any combination thereof. For example, the base substrate 110 may include at least two polymer films and an inorganic barrier layer disposed therebetween.

The barrier layer 112 and the buffer layer 114 may include an inorganic material. For example, each of the barrier layer 112 and the buffer layer 114 may include silicon oxide, silicon nitride, silicon oxynitride, or any combination thereof, and may have a single-layered structure or a multi-layered structure. In an embodiment, the barrier layer 112 may include silicon oxide, and the buffer layer 114 may have a stacked structure of a lower layer that includes silicon nitride and an upper layer that includes silicon oxide.

An active pattern AP and a first insulation layer 120 covering the active pattern AP are formed on the buffer layer 114. A first gate metal pattern that includes a gate electrode GE and an etch-delaying pattern EDP is formed on the first insulation layer 120.

For example, the active pattern AP may include multi-crystalline silicon (polysilicon). In an embodiment, an amorphous silicon layer may be formed on the buffer layer 114 and crystallized to form a polysilicon layer.

For example, the amorphous silicon layer may be formed through sputtering, low-pressure chemical vapor deposition (LPCVD), plasma-enhanced chemical vapor deposition (PECVD), or the like. The amorphous silicon layer may be crystallized through excimer laser annealing (ELA), sequential lateral solidification (SLS), or the like.

The polysilicon layer may be patterned by a photolithography or the like to form a semiconductor pattern that corresponds to the active pattern AP.

At least a portion of the semiconductor pattern may be doped with impurities. In an embodiment, the semiconductor pattern may be doped with p-type impurities such as boron or the like. However, the present disclosure is not limited thereto. For example, the semiconductor pattern may be doped with n-type impurities such as phosphorous, arsenic, or the like. For example, the semiconductor may have different concentrations of the n-type impurities in different portions.

The first insulation layer 120 may include an inorganic material, and may have a single-layered structure or a multi-layered structure. For example, the first insulation layer 120 may include silicon oxide, silicon nitride, silicon oxynitride, or any combination thereof. Furthermore, the first insulation layer 120 may include an insulating metal oxide such as aluminum oxide, tantalum oxide, hafnium oxide, zirconium oxide, titanium oxide, or any combination thereof. In an embodiment, the first insulation layer 120 may include silicon oxide. The first insulation layer 120 may be referred to as a first gate insulation layer.

In an embodiment, a first gate metal layer is formed on the first insulation layer 120 and patterned to form the first gate metal pattern that includes the gate electrode GE and the etch-delaying pattern EDP.

The gate electrode GE and the etch-delaying pattern EDP may overlap the active pattern AP. In an embodiment, the etch-delaying pattern EDP may include a plurality of patterns spaced apart from each other.

A second insulation layer 130 is formed on the first gate metal pattern and the first insulation layer 120. In an embodiment, a second gate metal layer is formed on the second insulation layer 130 and patterned to form a second gate metal pattern that includes a capacitor electrode pattern CP. A third insulation layer 140 is formed on the second gate metal pattern and the second insulation layer 130.

Each of the first and second gate metal patterns may include a metal, a metal alloy, a metal nitride, a conductive metal oxide, or the like. For example, each of the first and second gate metal layers may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layered structure or a multi-layered structure including different metal layers. In an embodiment, each of the first and second gate metal patterns may have a single-layered structure including molybdenum, or may have a multi-layered structure including a molybdenum layer.

Figure 14:
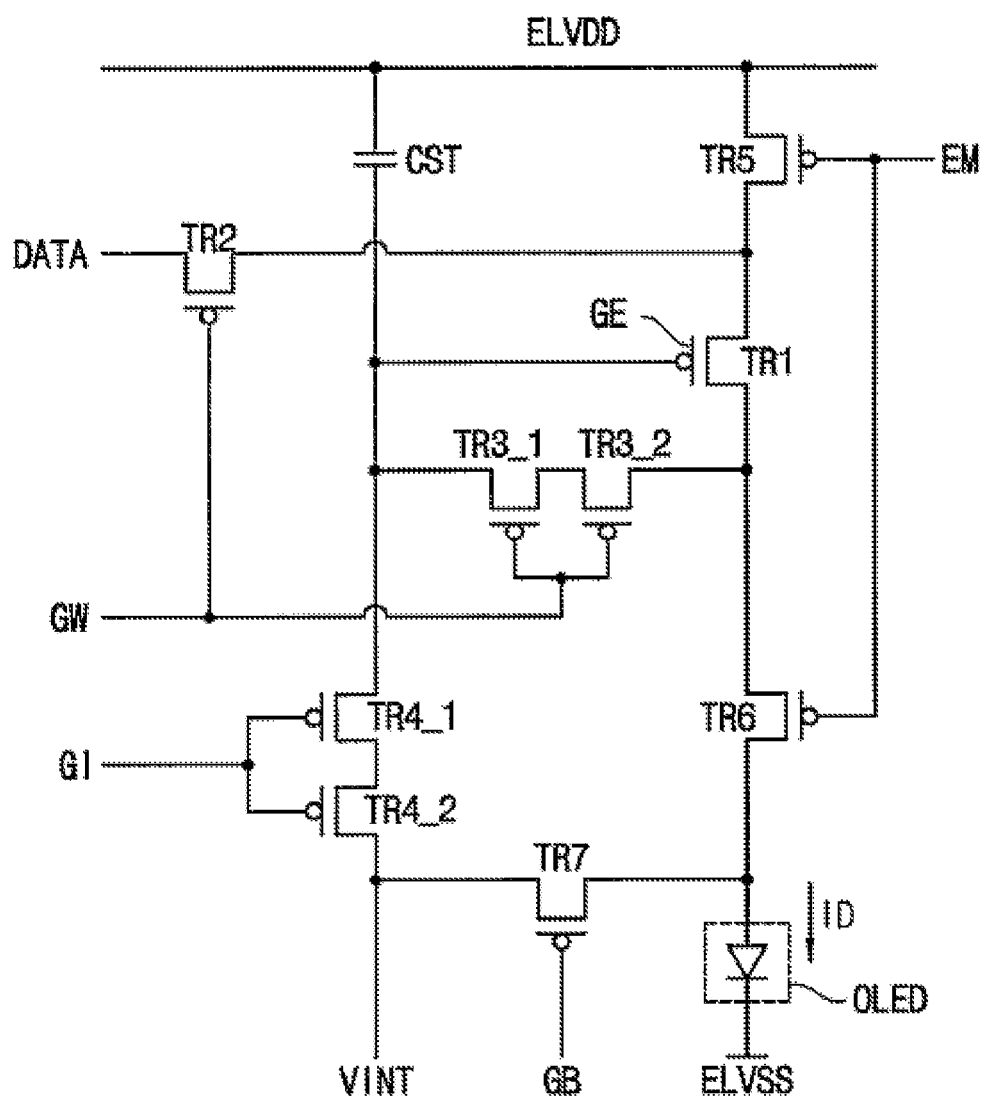
FIG. 14 is a circuit diagram illustrating a pixel unit of a display device according to an embodiment.

For example, at least a portion of the capacitor electrode pattern CP may correspond to a capacitor electrode of a storage capacitor (e.g., the storage capacitor CST of FIG. 14). In an embodiment, the second gate metal pattern may further include signal wirings that transfer an initialization signal, a shielding pattern, or the like.

Each of the second and third insulation layers 130 and 140 may include an inorganic material, and may have a single-layered structure or a multi-layered structure. For example, each of the second and third insulation layers 130 and 140 may include silicon oxide, silicon nitride, silicon oxynitride, or any combination thereof. Furthermore, each of the second and third insulation layers 130 and 140 may include an insulating metal oxide such as aluminum oxide, tantalum oxide, hafnium oxide, zirconium oxide, titanium oxide, or any combination thereof. In an embodiment, the second insulation layer 130 may include silicon nitride, and the third insulation layer 140 may have a stacked structure of a lower layer that includes silicon oxide and an upper layer that includes silicon nitride. The second insulation layer 130 may be referred to as a first interlayer insulation layer, and the third insulation layer 140 may be referred to as a second interlayer insulation layer.

A photoresist pattern PR1 is formed on the third insulation layer 140. The photoresist pattern PR1 may include a first opening OP1 that overlaps the etch-delaying pattern EDP. Thus, an upper surface of the third insulation layer 140 may be exposed through the first opening OP1.

Figure 4:
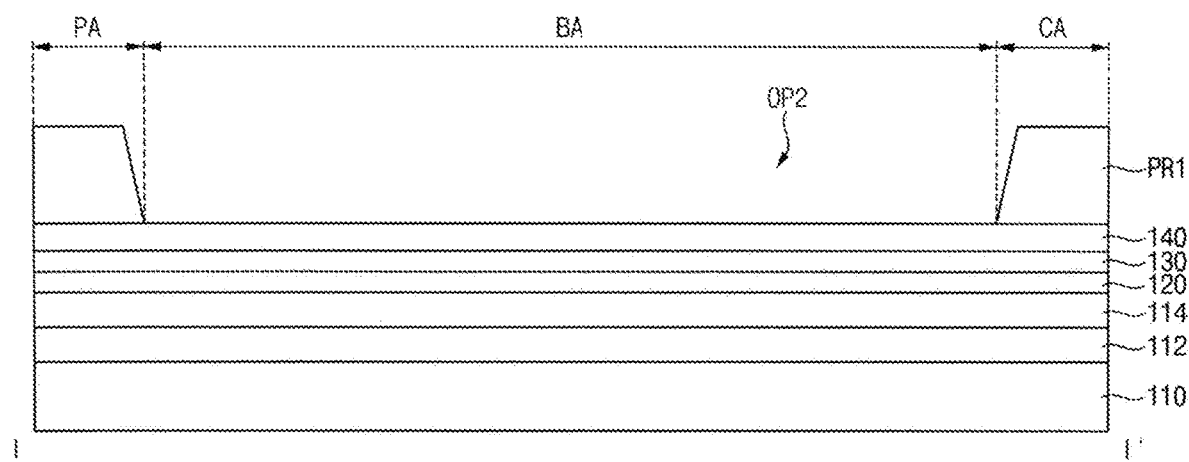

FIG. 4 illustrates a cross-sectional view of FIG. 2 taken along the line I-I'. Referring to FIG. 4 the barrier layer 112, the buffer layer 114, the first insulation layer 120, the second insulation layer 130, and the third insulation layer 140 may be disposed in the bending area BA. The barrier layer 112, the buffer layer 114, the first insulation layer 120, the second insulation layer 130, and the third insulation layer 140 may extend from the display area DA of the display device 100. The bending area BA may be disposed between the peripheral area PA and the connection area CA.

The photoresist pattern PR1 may not be disposed in the bending area BA. For example, the photoresist pattern PR1 may include a second opening OP2 that overlaps the bending area BA. Thus, an upper surface of the third insulation layer 140 may be exposed in the bending area BA.

Figure 5:
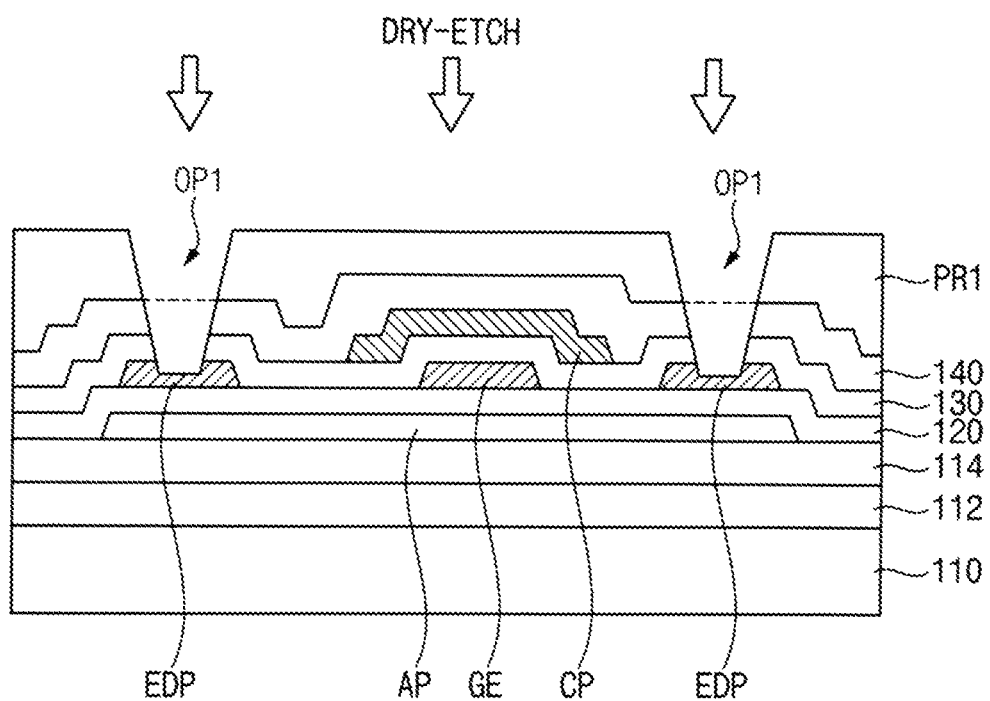
Figure 6:
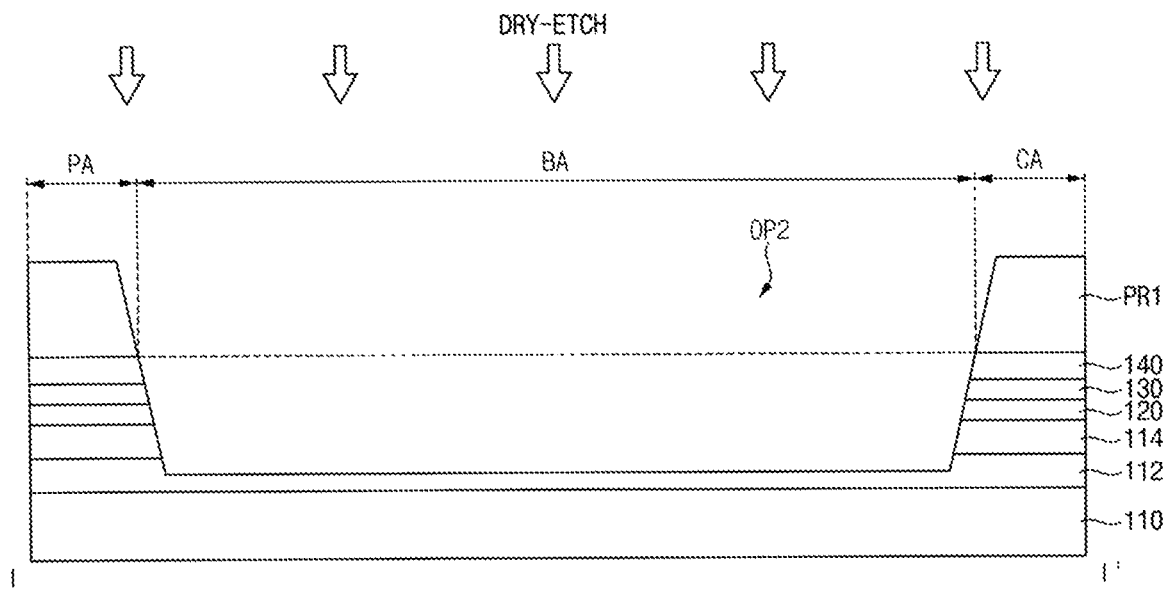

Referring to FIGS. 5 and 6, inorganic layers disposed in the pixel area PX and the bending area BA are etched by a first etching process using the photoresist pattern PR1 as a mask. For example, the first etching process may be a dry-etching process.

An etching depth of the inorganic layers may be properly adjusted as desired. As shown in FIG. 6, the third insulation layer 140, the second insulation layer 130, the first insulation layer 120, and the buffer layer 114 may be entirely removed in the bending area BA, and the barrier layer 112 may be partially removed in the bending area BA. However, the present disclosure is not limited thereto. The removal of the inorganic layers may vary depending on thicknesses of the inorganic layers and the etching depth.

For example, a sum of thicknesses of the removed inorganic layers in the bending area BA may be about 5,000Å to about 15,000Å. The etching depth may be adjusted depending on an etching depth of a second etching process that follows the first etching process. In an embodiment, a thickness of the barrier layer 112 that remains in the bending area BA after the first etching process may be similar to a thickness of the first insulation layer 120.

The inorganic layers overlapping the first opening OP1 may be etched in the pixel area PX by the first etching process. For example, the third insulation layer 140 and the second insulation layer 130 may be etched in an area overlapping the first opening OP1. In an embodiment, at least a portion of the etch-delaying pattern EDP may be etched or removed by the first etching process.

The etch-delaying pattern EDP may include a different material from the inorganic layers, for example, a metal. Thus, the etch-delaying pattern EDP may have a different etching rate from the inorganic layers. For example, the etch-delaying pattern EDP may include molybdenum. In the dry-etching process according to an embodiment, an etching selectivity (or an etching ratio) of silicon oxide to molybdenum may be about 4, and an etching selectivity of silicon nitride to molybdenum may be about 7. Thus, the etch-delaying pattern EDP may reduce an etching depth in an area where the etch-delaying pattern EDP is disposed. For example, at least a portion of the etch-delaying pattern EDP may remain at the end of the first etching process. Thus, the first insulation layer 120 that is disposed under the etch-delaying pattern EDP may not be etched by the first etching process.

For example, an area overlapping the first opening OP1 (or the etch-delaying pattern EDP) may be referred to as a first etching area, and an area overlapping the second opening OP2 may be referred to as a second etching area.

Figure 7:
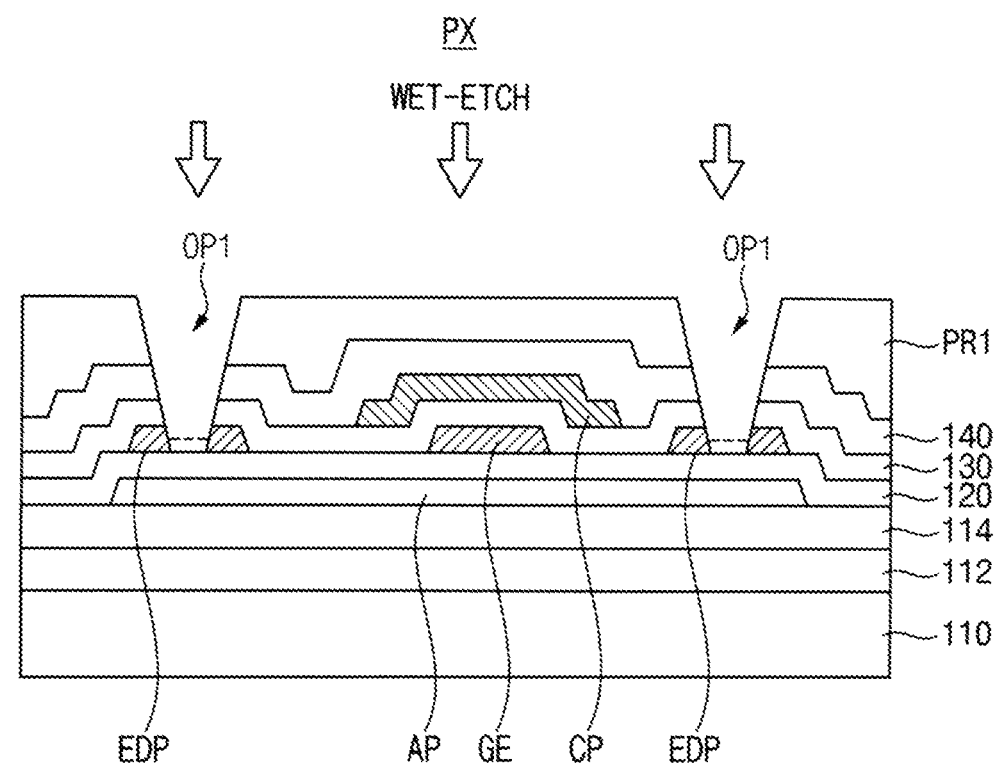

Referring to FIG. 7, a portion of the etch-delaying pattern EDP that remains in the area overlapping the first opening OP1 after the first etching process is removed to expose the first insulation layer 120 thereunder.

For example, the etch-delaying pattern EDP may be removed by a wet-etching process. Various etching compositions may be used for etching the etch-delaying pattern EDP depending on a material of the etch-delaying pattern EDP.

Figure 8:
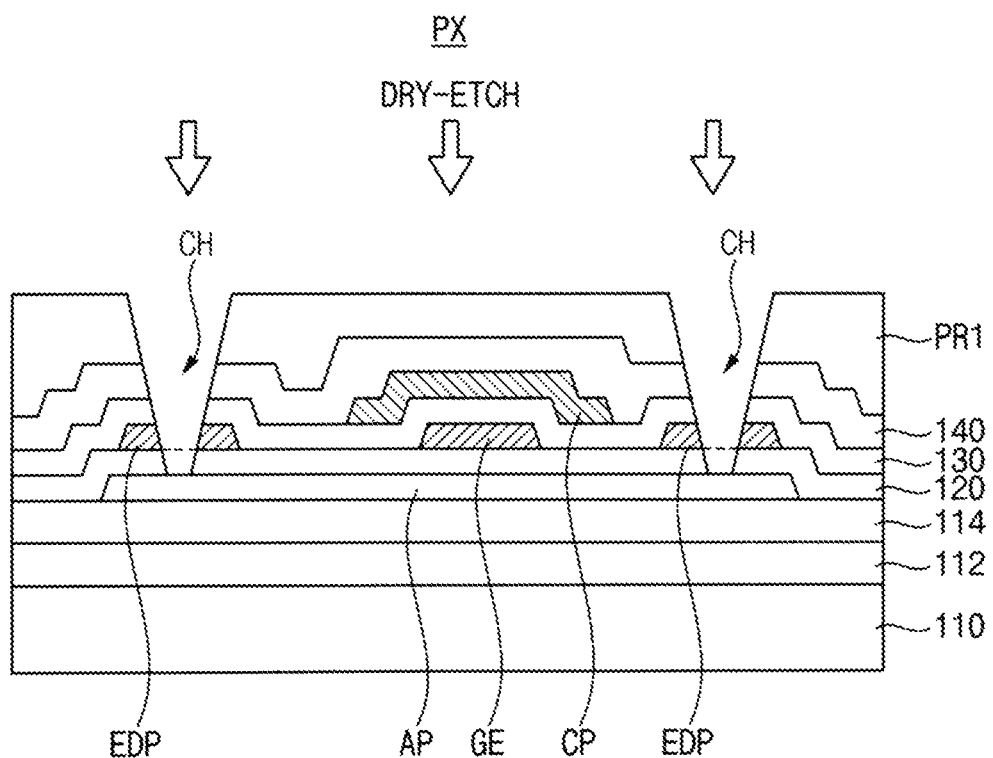
Figure 9:
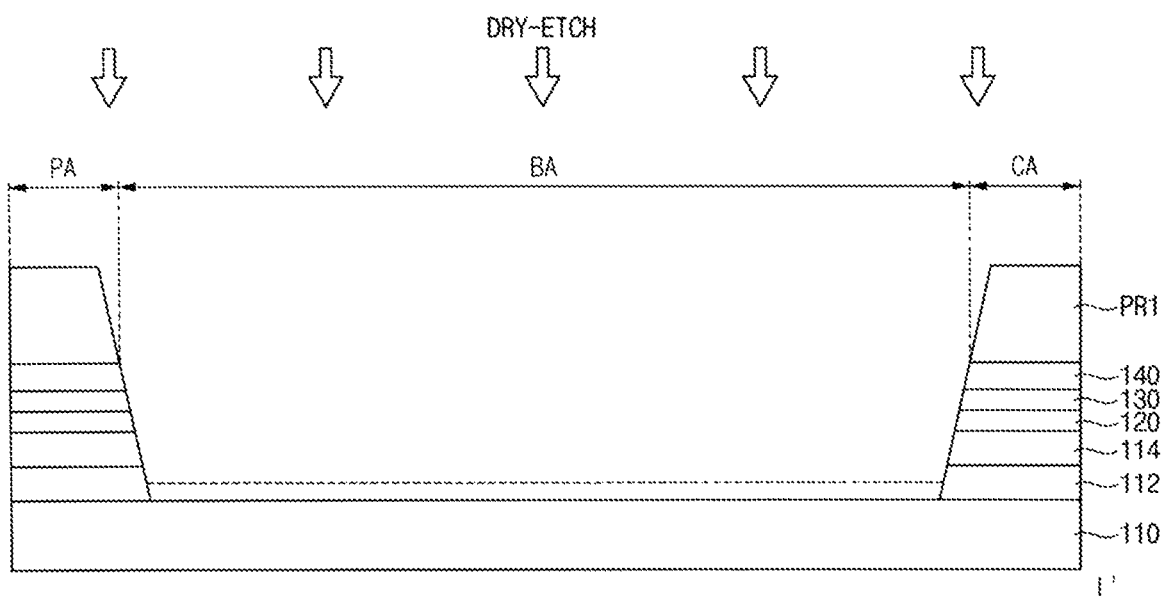

Referring to FIGS. 8 and 9, the inorganic layers disposed in the pixel area PX and the bending area BA are etched second time by a second etching process using the photoresist pattern PR1 as a mask. In one embodiment, the second etching process may be a dry-etching process.

For example, the barrier layer 112 may be removed in the bending area BA to expose an upper surface of the base substrate 110. The first insulation layer 120 overlapping the first opening OP1 may also be removed in the pixel area PX to form a contact hole CH to expose a portion of the active pattern AP.

In an embodiment, a thickness of the barrier layer 112 that is removed in the bending area BA in the second etching process may be similar to a thickness of the first insulation layer 120 that is removed in the pixel area PX by the second etching process. Thus, over-etching of the active pattern AP in the second etching process may be minimized to prevent a damage to the active pattern AP.

For example, the insulation layer etched in the first etching process may be referred to as an upper inorganic layer, and the insulation layer etched in the second etching process may be referred to as a lower inorganic layer.

Figure 10:
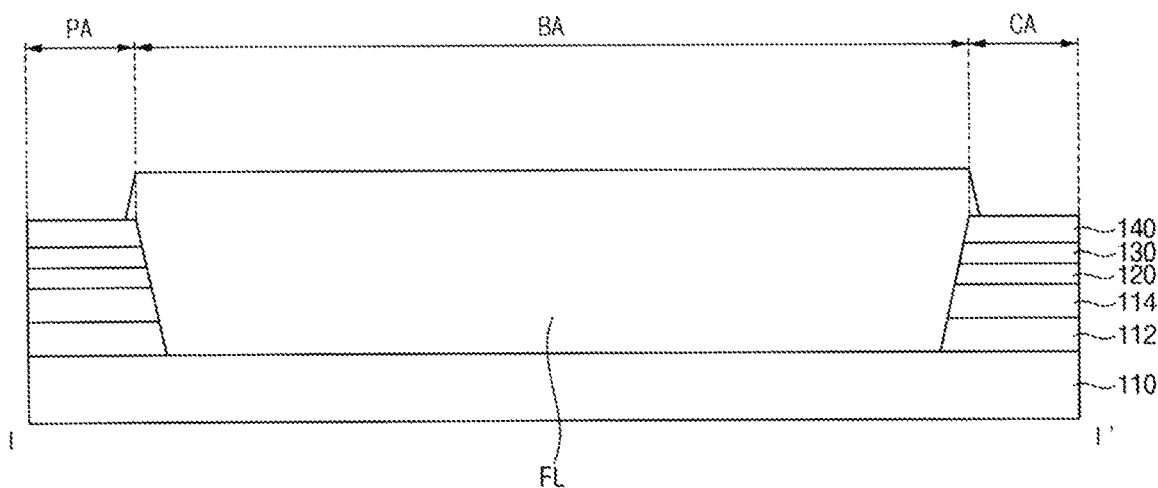

Referring to FIG. 10, the photoresist pattern PR1 is removed, and a filling member FL may be formed on the base substrate 110 in the bending area BA. For example, the filling member FL may include an organic material such as a phenol resin, an acryl resin, a polyimide resin, a polyamide resin, a siloxane resin, an epoxy resin, or the like.

Figure 11:
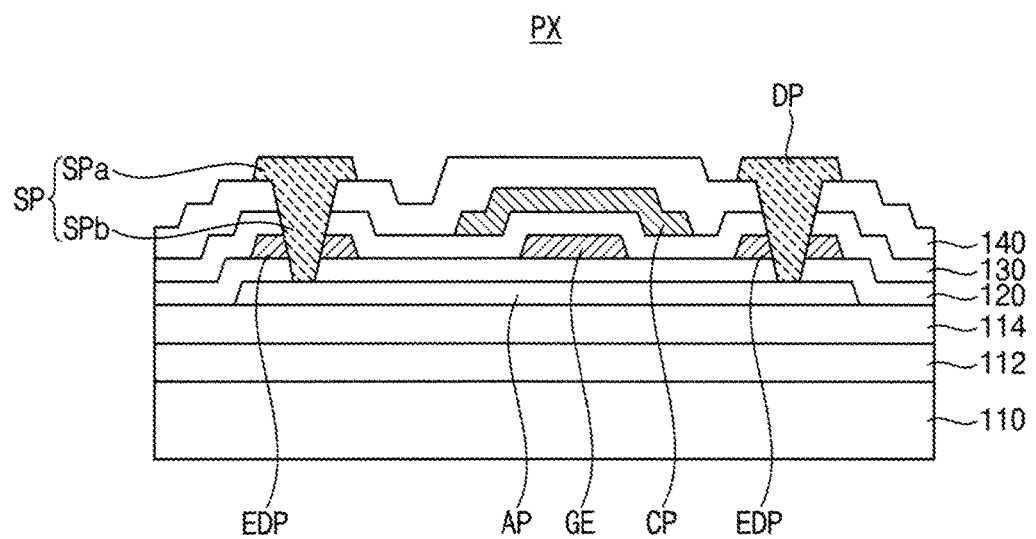
Figure 12:
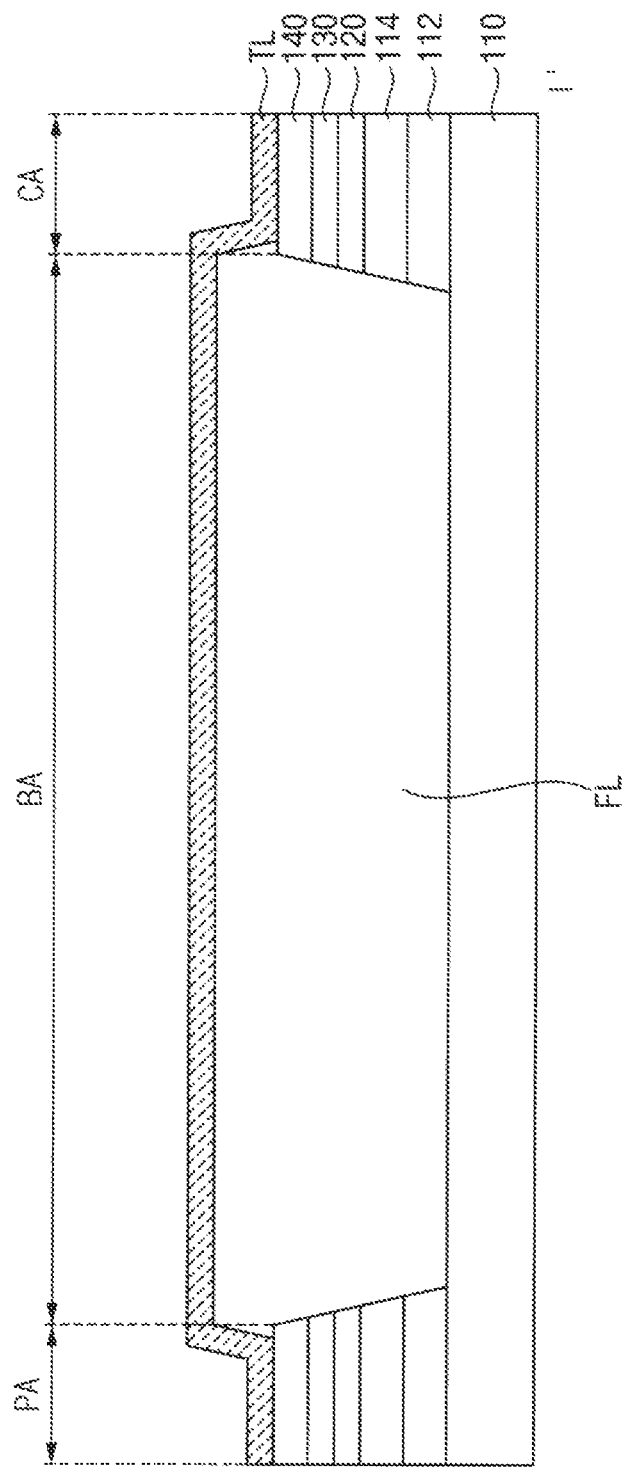

Referring to FIGS. 11 and 12, a source metal pattern is formed. The source metal pattern includes a source pattern SP and a drain pattern DP that pass through the corresponding contact hole in the pixel area PX to electrically contact source and drain regions of the active pattern AP, respectively. In an embodiment, the source pattern SP may be a power wiring that transfers a power voltage. However, the present disclosure is not limited thereto. For example, the source pattern SP may be a data line that transfers a data signal or a connection pattern that transfers other signals.

At least one of the source pattern SP and the drain pattern DP may contact the etch-delaying pattern EDP. For example, the source pattern SP and the drain pattern DP may pass through the etch-delaying pattern EDP to electrically contact the active pattern AP. For example, the etch-delaying pattern EDP may have a shape surrounding a contact portion of the source metal pattern in a plan view.

In an embodiment, the source pattern SP may include a first portion SPa that is disposed on the third insulation layer 140 and extends in a horizontal direction, and a second portion SPb that passes through the third insulation layer 140, the second insulation layer 130, and the first insulation layer 120 to electrically contact the active pattern AP. The etch-delaying pattern EDP may contact the second portion SPb. Similarly, the drain pattern DP may include a first portion that is disposed on the third insulation layer 140 and extends in a horizontal direction, and a second portion that passes through the third insulation layer 140, the second insulation layer 130, and the first insulation layer 120 to electrically contact the active pattern AP.

Referring to FIGS. 2 and 12, the source metal pattern may further include a transfer wiring TL that is disposed in the bending area BA. The transfer wiring TL may extend into the peripheral area PA from the connection area CA.

In an embodiment, the transfer wiring TL may be disposed on the filling member FL. Thus, disconnection of the transfer wiring TL due to a large height-difference of a structure that may be formed thereunder may be prevented. However, the present disclosure is not limited thereto. For example, the display device 100 according to an embodiment may not include the filling member FL, and may include the transfer wiring TL contacting the base substrate 110.

In an embodiment, a source metal layer is formed on the third insulation layer 140 and patterned to form the source metal pattern. For example, the source metal pattern may include a metal, a metal alloy, a metal nitride, a conductive metal oxide, or the like. For example, the source metal pattern may include gold (Au), silver (Ag), aluminum (Al), copper (Cu), nickel (Ni), platinum (Pt), magnesium (Mg), chromium (Cr), tungsten (W), molybdenum (Mo), titanium (Ti), tantalum (Ta), or an alloy thereof, and may have a single-layered structure or a multi-layered structure including different metal layers.

Figure 13:
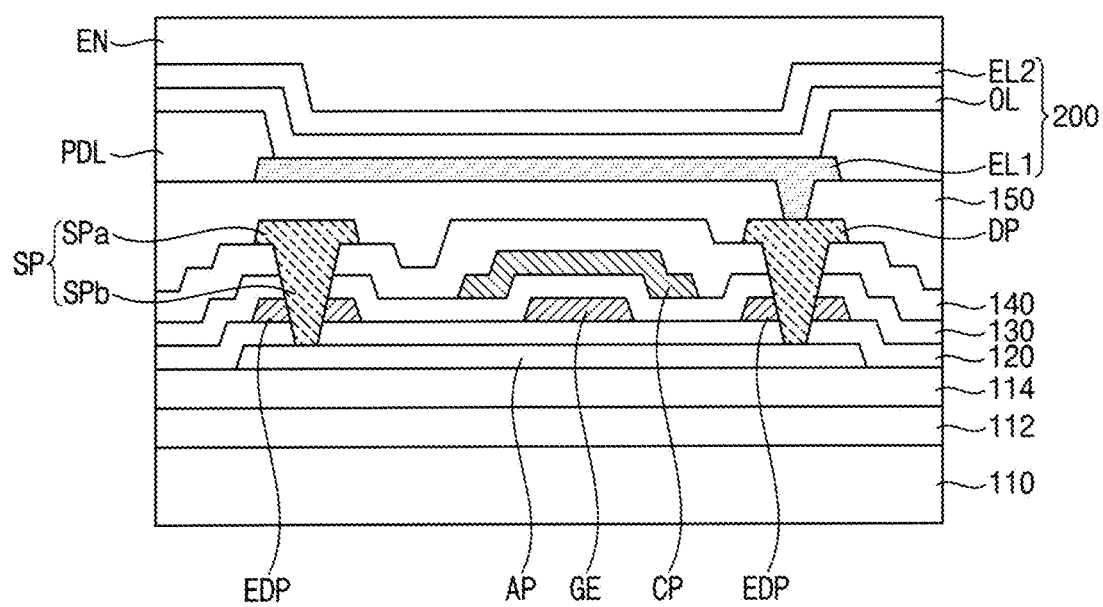

Referring to FIG. 13, a fourth insulation layer 150 is formed to cover the source metal pattern. For example, the fourth insulation layer 150 may include an organic material such as a phenol resin, an acryl resin, a polyimide resin, a polyamide resin, a siloxane resin, an epoxy resin, or the like. The fourth insulation layer 150 may be referred to as a via insulation layer or an organic insulation layer.

A first electrode EL1 of an organic light-emitting diode 200 and a pixel-defining layer PDL are formed on the fourth insulation layer 150.

The first electrode EL1 may correspond to an anode of the organic light-emitting diode 200. For example, the first electrode EL1 may be formed as a transmissive electrode or a reflective electrode according to an emission type of the display device 100. In a case where the first electrode EL1 is a transmissive electrode, the first electrode EL1 may include indium tin oxide, indium zinc oxide, zinc tin oxide, indium oxide, zinc oxide, tin oxide, or the like. In another case where the first electrode EL1 is a reflective electrode, the first electrode EL1 may include gold (Au), silver (Ag), aluminum (Al), copper (Cu), nickel (Ni), platinum (Pt), magnesium (Mg), chromium (Cr), tungsten (W), molybdenum (Mo), titanium (Ti), or any combination thereof, and may have a stacked structure including a material that may be used for the transmissive electrode.

The pixel-defining layer PDL includes an opening that exposes a portion of the first electrode EL1. For example, the pixel-defining layer PDL may include an organic insulation material.

An organic light-emitting layer OL is formed on the first electrode EL1. The organic light-emitting layer OL may include at least an emission layer, and may further include at least one of a hole injection layer (HIL), a hole transporting layer (HTL), an electron transporting layer (ETL), and an electron injection layer (EIL).

In an embodiment, the organic light-emitting layer OL may emit a red light, a green light, or a blue light. In another embodiment, the organic light-emitting layer OL may emit a white light. The organic light-emitting layer OL emitting a white light may have a multi-layer structure including a red light-emitting layer, a green light-emitting layer, and a blue light-emitting layer, or a single-layer structure including a mixture of a red light-emitting material, a green light-emitting material, and a blue light-emitting material.

In an embodiment, the organic light-emitting layer OL may be formed by screen printing, inkjet printing, vacuum evaporation, or the like.

A second electrode EL2 is formed on the organic light-emitting layer OL. The second electrode EL2 may correspond to a cathode of the organic light-emitting diode 200. The second electrode EL2 may be formed as a transmissive electrode or a reflective electrode according to an emission type of the display device 100. For example, the second electrode EL2 may include a metal, a metal alloy, a metal nitride, a metal fluoride, a conductive metal oxide, or any combination thereof.

For example, the second electrode EL2 may be formed as a common layer extending continuously over a plurality of the pixel areas PX. In an embodiment, a capping layer and/or a blocking layer may be further formed on the second electrode EL2.

An encapsulation layer EN may be formed on the organic light-emitting diode 200. In an embodiment, the encapsulation layer EN may have a stacked structure of an inorganic thin film and an organic thin film.

For example, the organic thin film may include a cured polymer resin such as poly(meth)acrylate, or the like. For example, the cured polymer resin may be formed by cross-linking reaction of monomers. For example, the inorganic thin films may include silicon oxide, silicon nitride, silicon oxynitride, aluminum oxide, tantalum oxide, hafnium oxide, zirconium oxide, titanium oxide, or any combination thereof.

As discussed above, the etch-delaying pattern EDP may be used when a plurality of areas (e.g., the first etching area and the second etching area) are etched with different etching depths. Thus, a damage to an element that is disposed under the etch-delaying pattern EDP may be prevented. Furthermore, the above-described etching process(es) may be performed with a single mask so that a manufacturing efficiency of the display device 100 may be increased.

Figure 15:
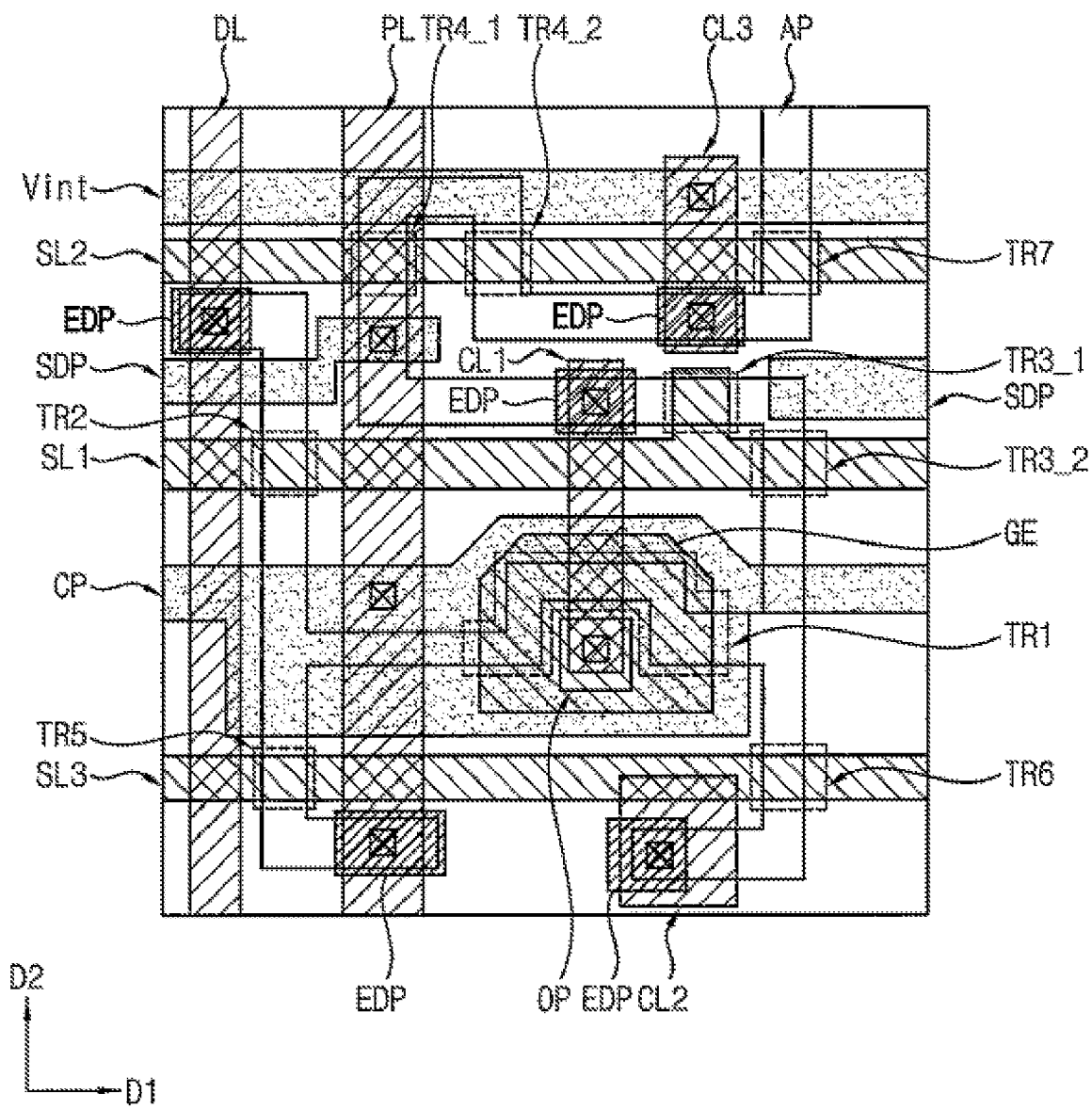
FIG. 15 is a plan view illustrating a pixel unit of a display device according to an embodiment.

FIG. 14 is a circuit diagram illustrating the pixel unit PX of the display device 100 according to an embodiment. FIG. 15 is a plan view illustrating the pixel unit PX of the display device 100 according to an embodiment.

Referring to FIGS. 14 and 15, the pixel unit PX of the display device 100 may include a first transistor TR1, a second transistor TR2, third transistors TR3_1 and TR3_2, fourth transistors TR4_1 and TR4_2, a fifth transistor TR5, a sixth transistor TR6, a seventh transistor TR7, an organic light-emitting diode OLED, the active pattern AP, the gate electrode GE, a first scan line SL1, a second scan line SL2, a third scan line SL3, the etch-delaying pattern EDP, the capacitor electrode pattern CP, a shielding pattern SDP, an initialization voltage wiring Vint, a data line DL, and a power wiring PL.

The first scan line SL1 may transfer a scan signal GW to the second transistor TR2 and the third transistors TR3_1 and TR3_2. Portions of the active pattern AP that overlap the first scan line SL1 may correspond to channels of the second transistor TR2 and the third transistors TR3_1 and TR3_2.

The second scan line SL2 may transfer a data initialization signal GI and a diode initialization signal GB to the fourth transistors TR4_1 and TR4_2 and the seventh transistor TR7, respectively. Portions of the active pattern AP that overlap the second scan line SL2 may correspond to channels of the fourth transistors TR4_1 and TR4_2 and the seventh transistor TR7.

The third scan line SL3 may transfer an emission control signal EM to the fifth transistors TR5 and the sixth transistor TR6. Portions of the active pattern AP that overlap the third scan line SL3 may correspond to channels of the fifth transistors TR5 and the sixth transistor TR6.

A portion of the active pattern AP that overlaps the gate electrode GE may correspond to a channel of the first transistor TR1. The gate electrode GE may be electrically connected to a portion of the active pattern AP that corresponds to an output terminal of the fourth transistors TR4_1 and TR4_2, through a first connection wiring CL1.

In an embodiment, the first to third scan lines SL1, SL2, and SL3 may extend in a first direction D1.

In an embodiment, the gate electrode GE and the first to third scan lines SL1, SL2, and SL3 may be disposed in the same layer. For example, the gate electrode GE and the first to third scan lines SL1, SL2, and SL3 may be referred to as the first gate metal pattern. However, the present disclosure is not limited thereto. For example, at least one of the gate electrode GE and the first to third scan lines SL1, SL2, and SL3 may be disposed in a different layer from others.

The capacitor electrode pattern CP may be electrically connected to the power wiring PL to receive a high power voltage ELVDD. The capacitor electrode pattern CP may overlap the gate electrode GE to form a storage capacitor CST.

The capacitor electrode pattern CP may be disposed on the gate electrode GE and may include an opening OP that overlaps the gate electrode GE. The first connection wiring CL1 may electrically contact the gate electrode GE through the opening OP.

The shielding pattern SDP may overlap the active pattern AP between the channels of the third transistors TR3_1 and TR3_2. The shielding pattern SDP may be electrically connected to the power wiring PL to receive the high power voltage ELVDD.

The initialization voltage wiring Vint may transfer an initialization voltage VINT to the fourth transistors TR4_1 and TR4_2.

In an embodiment, the capacitor electrode pattern CP, the shielding pattern SDP, and the initialization voltage wiring Vint may be disposed in the same layer. For example, the capacitor electrode pattern CP, the shielding pattern SDP, and the initialization voltage wiring Vint may be referred to as the second gate metal pattern. However, the present disclosure is not limited thereto. For example, at least one of the capacitor electrode pattern CP, the shielding pattern SDP, and the initialization voltage wiring Vint may be disposed in a different layer from others.

The data line DL may transfer a data signal DATA. The data line DL may be electrically connected to the active pattern AP to transfer the data signal DATA to the second transistor TR2.

The power wiring PL may transfer the high power voltage ELVDD. The power wiring PL may be electrically connected to the active pattern AP to transfer the high power voltage ELVDD to the fifth transistor TR5.

In an embodiment, the data line DL and the power wiring PL may extend in a second direction D2 that crosses the first direction D1.

In an embodiment, the first connection wiring CL1, the data line DL, and the power wiring PL may be disposed in the same layer. For example, the first connection wiring CL1, the data line DL, and the power wiring PL may be referred to as a first source metal pattern. The first source metal pattern may further include a second connection wiring CL2 and a third connection wiring CL3. The second connection wiring CL2 may electrically connect the sixth transistor TR6 to a first electrode of the organic light-emitting diode OLED. A second electrode of the organic light-emitting diode OLED may be connected to a low power voltage ELVSS. The third connection wiring CL3 may electrically connect the initialization voltage wiring Vint to the active pattern AP. However, the present disclosure is not limited thereto. For example, at least one of the first to third connection wirings CL1, CL2 and CL3, the data line DL, and the power wiring PL may be disposed in a different layer from others. The first transistor TR1 receives the data signal DATA according to a switching operation of the second transistor TR2 and provides a driving current ID to the organic light-emitting diode OLED, and the organic light-emitting diode OLED emits light according to the driving current ID that flows through the first transistor TR1. The storage capacitor CST may serve to constantly maintain a data voltage applied to the gate electrode GE of the first transistor T1.

In some embodiments, the pixel unit PX of the display device 100 according to an embodiment may further include another active layer and/or another metal layer in addition to the active pattern AP, the first gate metal pattern, the second gate metal pattern, and the first source metal pattern.

In an embodiment, the etch-delaying pattern EDP may be disposed in an area where the source metal pattern electrically contacts the active pattern AP. The etch-delaying pattern EDP may be disposed between the source metal pattern and the active pattern AP. The display device 100 may include a plurality of the etch-delaying patterns EDP. The etch-delaying pattern EDP may be disposed between the data line DL and the active pattern, between the power wiring PL and the active pattern AP, or between the first to third connection wirings CL1, CL2 and CL3 and the active pattern AP. The source metal pattern may pass through the etch-delaying pattern EDP to electrically contact the active pattern AP.

In an embodiment, the etch-delaying pattern EDP may be disposed in the same layer as the gate electrode GE. In this case, the etch-delaying pattern EDP may be included in the first gate metal pattern.

The etch-delaying pattern EDP may have various shapes. For example, the etch-delaying pattern EDP may have a rectangular shape, a triangular shape, a circular shape, or the like, in a plan view.

Figure 16:
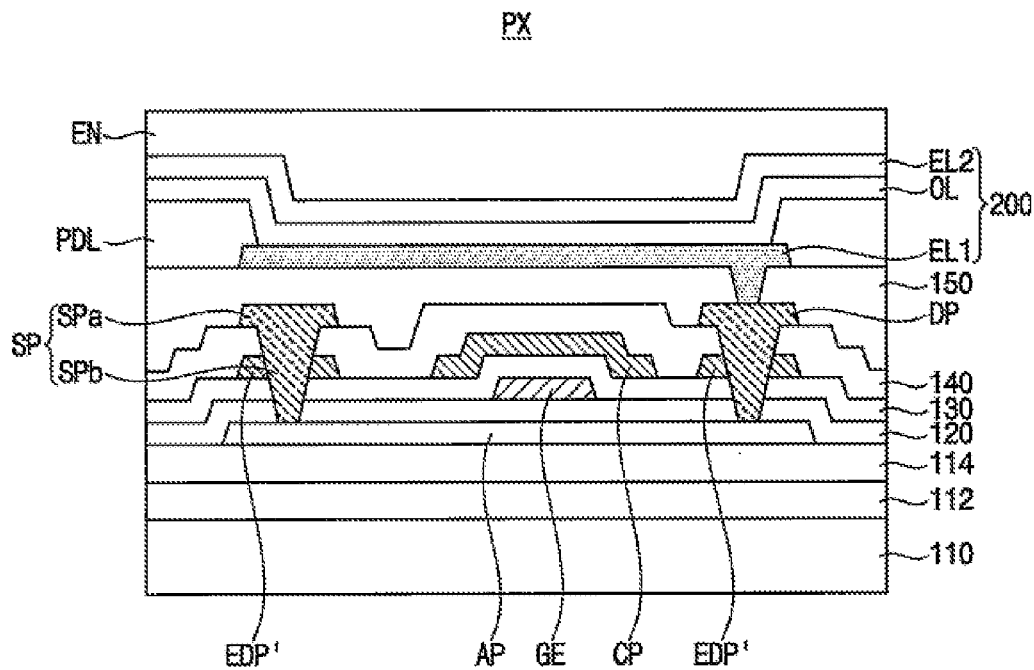
FIG. 16 is a cross-sectional view illustrating a display device according to another embodiment.

FIG. 16 is a cross-sectional view illustrating a display device according to another embodiment.

Referring to FIG. 16, the display device includes an etch-delaying pattern EDP' that overlaps an active pattern AP and a source metal pattern. The etch-delaying pattern EDP' is disposed on an inorganic insulation layer that covers the active pattern AP. The source metal pattern may contact the etch-delaying pattern EDP'. For example, the source metal pattern may be disposed on the etch-delaying pattern EDP' and may pass through the etch-delaying pattern EDP' to electrically contact the active pattern AP. For example, the source metal pattern may include a source pattern SP and a drain pattern DP that are spaced apart from each other. The etch-delaying pattern EDP' may be each disposed between a first portion SPa of the source pattern SP and the active pattern AP and between a first portion of drain pattern DP and the active pattern AP. A second portion SPb of the source pattern SP may pass through the etch-delaying pattern EDP' to contact the active pattern AP.

In an embodiment, the etch-delaying pattern EDP' may be disposed in the same layer as a capacitor electrode pattern CP disposed on a gate electrode GE. Thus, the etch-delaying pattern EDP' may be disposed in a layer different from the gate electrode GE. For example, a first insulation layer 120 and a second insulation layer 130 may be disposed between the etch-delaying pattern EDP' and the active pattern AP. A third insulation layer 140 may be disposed between the etch-delaying pattern EDP' and the source metal pattern.

FIGS. 17, 18, 19, 20, 21 and 22 are cross-sectional views illustrating a method for manufacturing a display device according to an embodiment.

Figure 17:
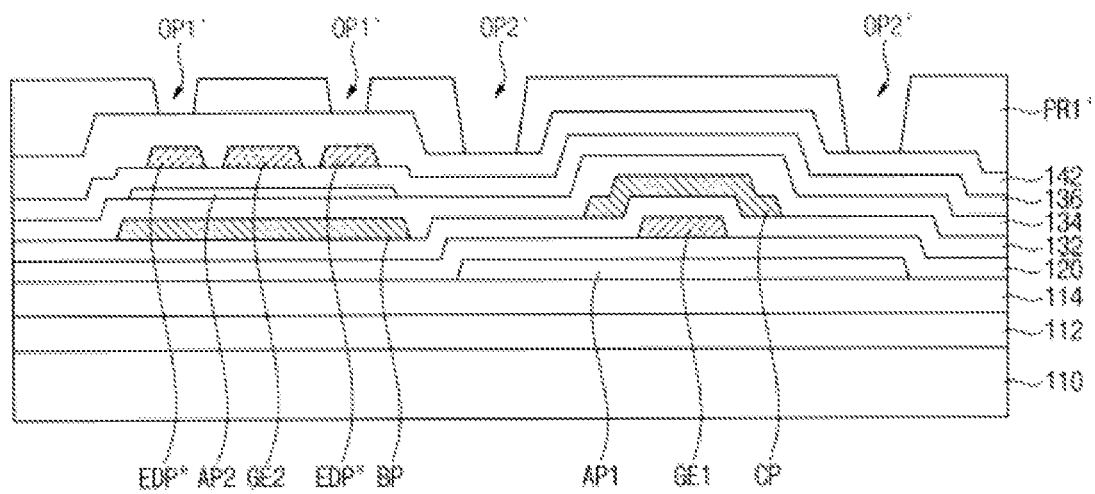

Referring to FIG. 17, a barrier layer 112 and a buffer layer 114 are formed on a base substrate 110 in a pixel area PX.

A first active pattern AP1 and a first insulation layer 120 covering the first active pattern AP1 are formed on the buffer layer 114. A first gate metal pattern including a first gate electrode GE1 is formed on the first insulation layer 120. In an embodiment, the first active pattern AP1 may include multi-crystalline silicon (polysilicon).

A first gate metal layer is formed on the first insulation layer 120, and patterned to form the first gate metal pattern including the first gate electrode GE1. A second insulation layer 132 is formed on the first gate metal pattern. A second gate metal layer is formed on the second insulation layer 132, and patterned to form a second gate metal pattern including a capacitor electrode pattern CP.

The second gate metal pattern may further include a bottom gate pattern BP. The bottom gate pattern BP may overlap a second active pattern AP2 disposed thereon. The bottom gate pattern BP may block a light incident on a lower surface of the second active pattern AP2 to prevent characteristic variance of a driving element including the second active pattern AP2. For example, the bottom gate pattern BP may receive the same gate signal applied to a second gate electrode GE2.

A third insulation layer 134 is formed on the second gate metal pattern. The second active pattern AP2, a fourth insulation layer 136 covering the second active pattern AP2, a third gate metal pattern formed on the fourth insulation layer 136, and a fifth insulation layer 142 covering the third gate metal pattern are formed on the third insulation layer 134.

The second active pattern AP2 may include a metal oxide semiconductor. For example, the second active pattern AP2 may include a binary compound ($AB_x$), ternary compound ($AB_xC_y$) or a quaternary compound ($AB_xC_yD_z$) that contains indium (In), zinc (Zn), gallium (Ga), tin (Sn), titanium (Ti), aluminum (Al), hafnium (Hf), zirconium (Zr), and/or magnesium (Mg). For example, the second active pattern AP2 may include zinc oxide ($ZnO_x$), gallium oxide ($GaO_x$), titanium oxide ($TiO_x$), tin oxide ($SnO_x$), indium oxide ($InO_x$) indium-gallium oxide (IGO), indium-zinc oxide (IZO), indium tin oxide (ITO), gallium zinc oxide (GZO), zinc magnesium oxide (ZMO), zinc tin oxide (ZTO), zinc zirconium oxide ($Z_nZr_xO_y$), indium-gallium-zinc oxide (IGZO), indium-zinc-tin oxide (IZTO), indium-gallium-hafnium oxide (IGHO), tin-aluminum-zinc oxide (TAZO), indium-gallium-tin oxide (IGTO), or the like.

The third gate metal pattern includes the second gate electrode GE2 that overlaps the second active pattern AP2. The third gate metal pattern may include the same material as the first gate metal pattern and/or the second gate metal pattern.

In an embodiment, the third gate metal pattern further includes an etch-delaying pattern EDP''. The etch-delaying pattern EDP'' overlaps the second active pattern AP2. The etch-delaying pattern EDP'' may be spaced apart from the second gate electrode GE2 with the fifth insulation layer 142 interposed therebetween.

Each of the first insulation layer 120, the second insulation layer 132, the third insulation layer 134, the fourth insulation layer 136, and the fifth insulation layer 142 may include an inorganic material, and may have a single-layered structure or a multi-layered structure. For example, each of the first insulation layer 120, the second insulation layer 132, the third insulation layer 134, the fourth insulation layer 136, and the fifth insulation layer 142 may include silicon oxide, silicon nitride, silicon oxynitride, or any combination thereof. Furthermore, each of the first insulation layer 120, the second insulation layer 132, the third insulation layer 134, the fourth insulation layer 136, and the fifth insulation layer 142 may include an insulating metal oxide such as aluminum oxide, tantalum oxide, hafnium oxide, zirconium oxide, titanium oxide, or any combination thereof.

In an embodiment, the first insulation layer 120 may include silicon oxide. The second insulation layer 132 may include silicon nitride. The third insulation layer 134 may have a stacked structure of a lower layer that includes silicon nitride and an upper layer that includes silicon oxide. The fourth insulation layer 136 may include silicon oxide. The fifth insulation layer 142 may have a stacked structure of a lower layer that includes silicon oxide and an upper layer that includes silicon nitride.

A photoresist pattern PR1' is formed on the fifth insulation layer 142. The photoresist pattern PR1' may include a first opening OP1' that overlaps the etch-delaying pattern EDP'' and a second opening OP2' that overlaps the first active pattern AP1. An upper surface of the fifth insulation layer 142 may be exposed through the first opening OP1' and the second opening OP2'.

Figure 18:
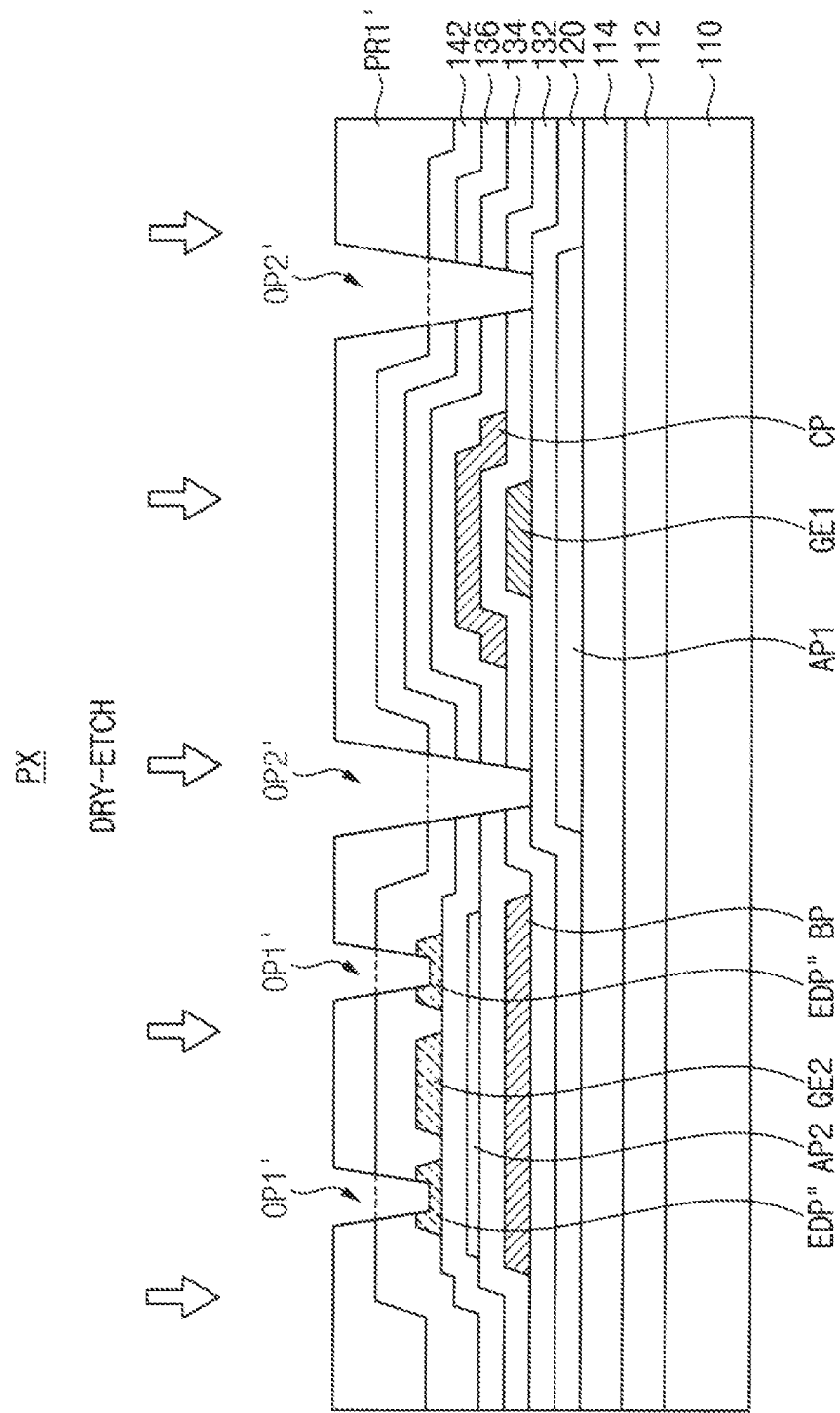

Referring to FIG. 18, the inorganic layers overlapping the first opening OP1' and the second opening OP2' are etched by a first etching process using the photoresist pattern PR1' as a mask. In an embodiment, the first etching process may be a dry-etching process.

An etching depth of the inorganic layers may be properly adjusted as desired. In an embodiment, the fifth insulation layer 142, the fourth insulation layer 136, the third insulation layer 134, and the second insulation layer 132 may be removed in an area overlapping the second opening OP2'. However, the present disclosure is not limited thereto. The removed inorganic layers may be varied depending on thicknesses of the inorganic layers and the etching depth. For example, a portion of the first insulation layer 120 may be further removed in the area overlapping the second opening OP2', or at least a portion of the second insulation layer 132 may remain in the area that overlaps the second opening OP2'.

The etching depth may be adjusted depending on an etching depth of a second etching process that follows the first etching process. In an embodiment, a thickness of the inorganic layers remaining in the area overlapping the second opening OP2' after the first etching process may be similar to a thickness of the fourth insulation layer 136.

In the same process as the above, the inorganic layers may be etched in an area overlapping the first opening OP1'. For example, the fifth insulation layer 142 may be removed in an area overlapping the first opening OP1'. In an embodiment, at least a portion of the etch-delaying pattern EDP" may be etched or removed.

The etch-delaying pattern EDP" may include a different material from the inorganic layers, for example, a metal. Thus, the etch-delaying pattern EDP" may have a different etching rate from the inorganic layers. For example, the etch-delaying pattern EDP" may include molybdenum. Thus, the etch-delaying pattern EDP" may reduce an etching depth in an area where the etch-delaying pattern EDP" is disposed. For example, at least a portion of the etch-delaying pattern EDP" may remain at the end of the first etching process. Thus, the fourth insulation layer 136 that is disposed under the etch-delaying pattern EDP" may not be etched by the first etching process.

Figure 19:
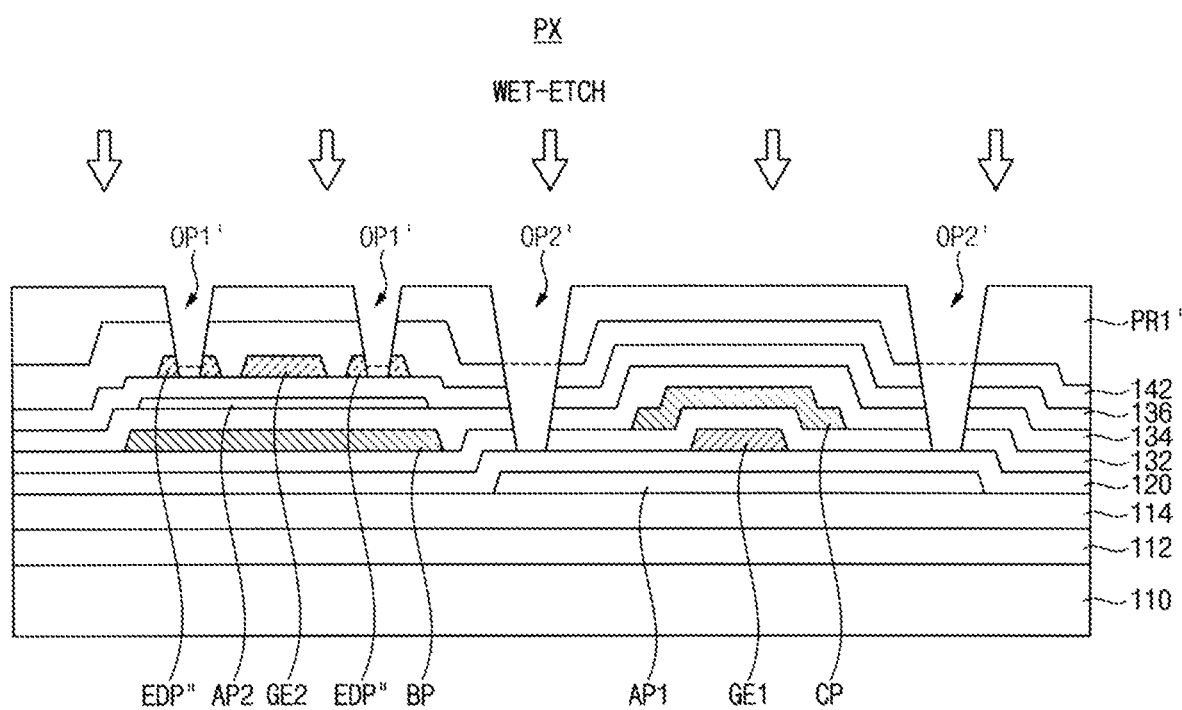

Referring to FIG. 19, a portion of the etch-delaying pattern EDP" that remains in the area overlapping the first opening OP1' after the first etching process is removed to expose the fourth insulation layer 136 thereunder.

For example, the etch-delaying pattern EDP" may be removed by a wet-etching process. Various etching compositions may be used for etching the etch-delaying pattern EDP" depending on a material of the etch-delaying pattern EDP".

Figure 20:
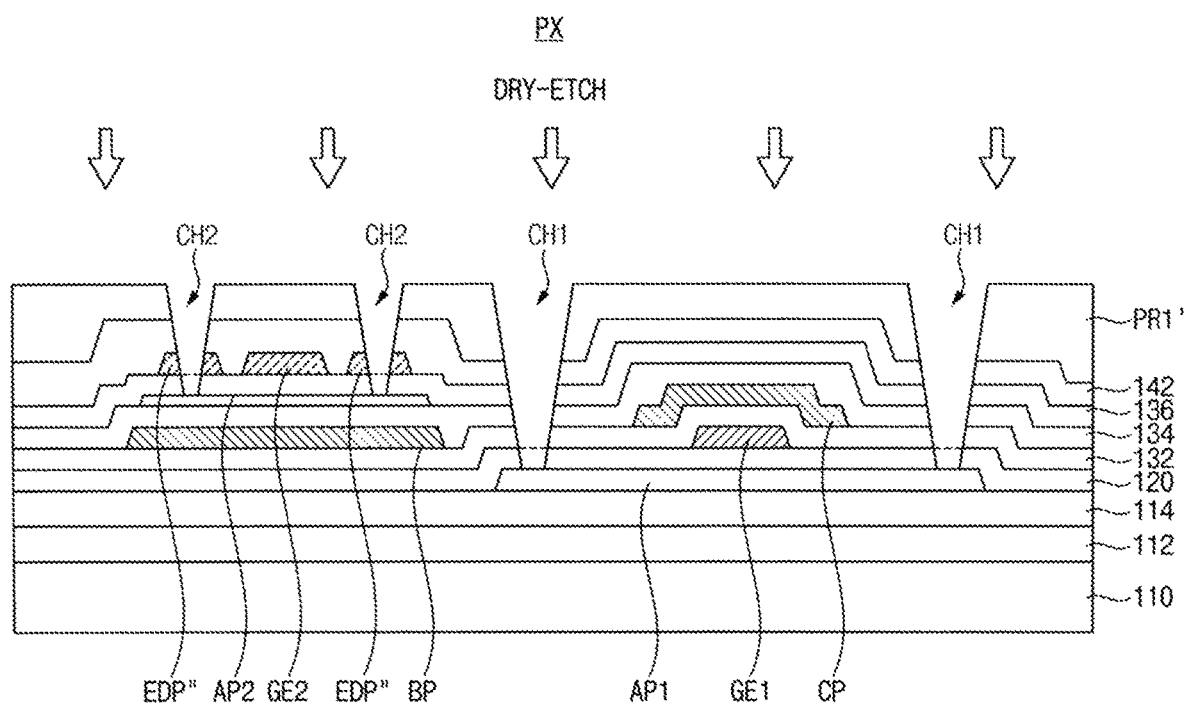

Referring to FIG. 20, the inorganic layers overlapping the first opening OP1' and the second opening OP2' are etched a second time by a second etching process. In an embodiment, the second etching process may be a dry-etching process.

For example, the fourth insulation layer 136 may be removed in the area overlapping the first opening OP1' to form a second contact hole CH2 to expose an upper surface of the second active pattern AP2. The first insulation layer 120 may be removed in the area overlapping the second opening OP2' to form a first contact hole CH1 that exposes an upper surface of the first active pattern AP1.

Figure 21:
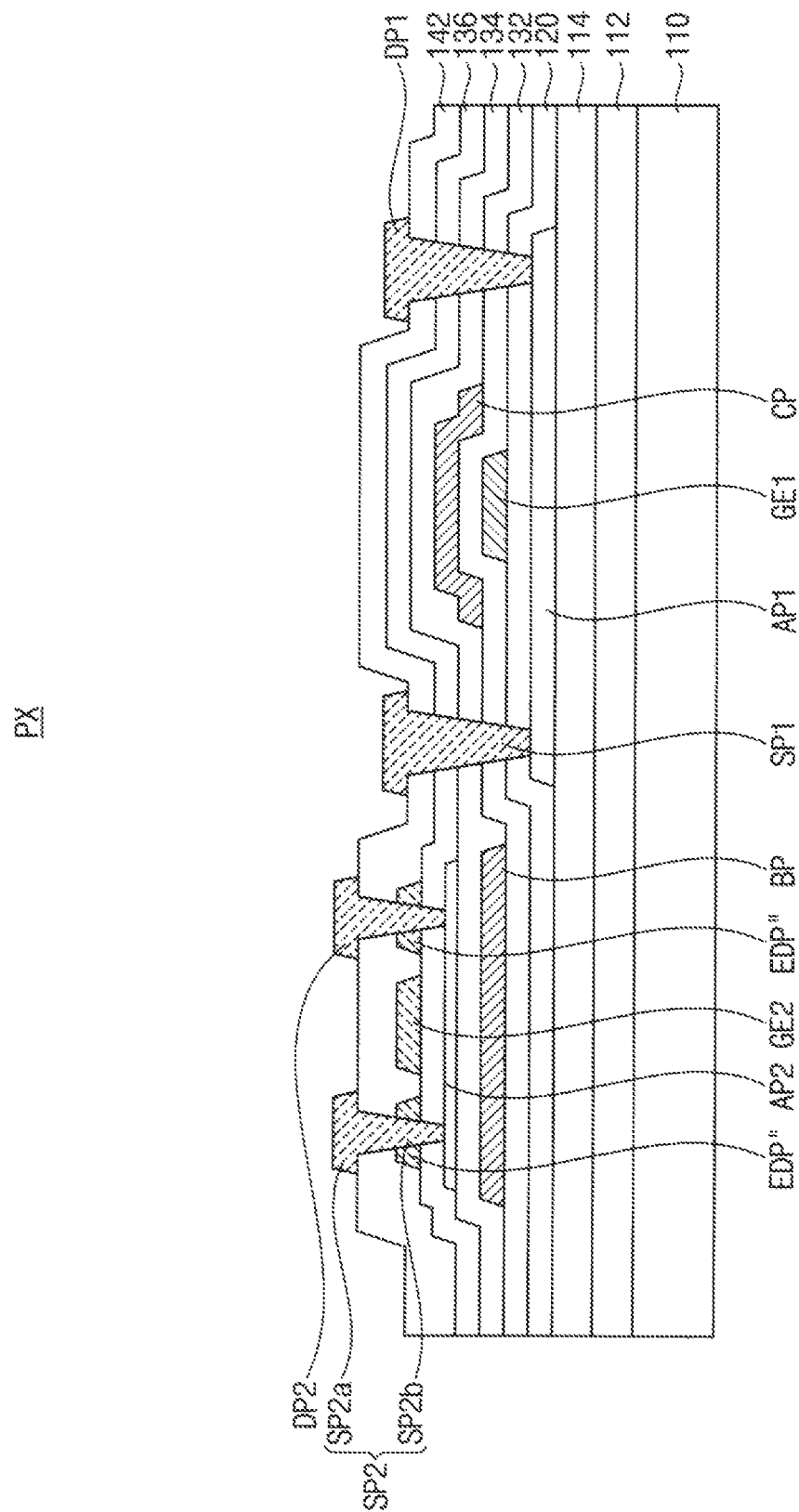

Referring to FIG. 21, the photoresist pattern PR1' is removed, and a first source metal pattern contacting the first and second active patterns AP1 and AP2 through the contact holes is formed. For example, the first source metal pattern may include a first source pattern SP1, a first drain pattern DP1, a second source pattern SP2, and a second drain pattern DP2. The first source pattern SP1 and the first drain pattern DP1 may electrically contact the first active pattern AP1. The second source pattern SP2 and the second drain pattern DP2 may electrically contact the second active pattern AP2.

For example, at least one of the second source pattern SP2 and the second drain pattern DP2 may contact the etch-delaying pattern EDP". For example, the second source pattern SP2 may include a first portion SP2a that is disposed on the fifth insulation layer 142, and a second portion SP2b that passes through the etch-delaying pattern EDP" to electrically contact the second active pattern AP2.

Referring to FIG. 22, a sixth insulation layer 152 is formed to cover the first source metal pattern. For example, the sixth insulation layer 152 may include an organic material such as a phenol resin, an acryl resin, a polyimide resin, a polyamide resin, a siloxane resin, an epoxy resin, or the like. The sixth insulation layer 152 may be referred to as a first via insulation layer or a first organic insulation layer.

A second source metal pattern is formed on the sixth insulation layer 152. For example, the second source metal pattern may include a connection electrode CE that passes through the sixth insulation layer 152 to electrically contact the first drain pattern DP1. For example, the second source metal pattern may include the same material as the first source metal pattern.

Thereafter, a seventh insulation layer 162 is formed to cover the second source metal pattern. The seventh insulation layer 162 may include an organic insulation material. The seventh insulation layer 162 may be referred to as a second via insulation layer or a second organic insulation layer.

A first electrode EL1 of an organic light-emitting diode 200 and a pixel-defining layer PDL are formed on the seventh insulation layer 162. An organic light-emitting layer OL is formed on the first electrode EL1. A second electrode EL2 is formed on the organic light-emitting layer OL.

An encapsulation layer EN may be formed on the organic light-emitting diode 200. In an embodiment, the encapsulation layer EN may have a stacked structure including an inorganic thin film and an organic thin film.

In an embodiment, over-etching of the first and second active patterns AP1 and AP2 may be minimized in the second etching process that exposes the first and second active patterns AP1 and AP2 using the etch-delaying pattern EDP". Thus, a damage to the first and second active patterns AP1 and AP2 may be prevented, and contact holes exposing the first and second active patterns AP1 and AP2 may be formed using the same mask.

The embodiments disclosed herein may be applied to various display devices. Examples of the applicable display devices include, but are not limited to, a vehicle-display device, a ship-display device, an aircraft-display device, a portable communication device, a display device for displaying an image or for transferring information, a medical-display device, etc.

The foregoing is illustrative of some embodiments of the present disclosure and is not to be construed as limiting thereof. Although some embodiments of the present disclosure have been described, those skilled in the art will readily appreciate that various modifications are possible in the disclosed embodiments without materially departing from the novel teachings and aspects of the present inventive concept. Accordingly, such modifications are intended to be included within the scope of the present inventive concept. Therefore, it is to be understood that the foregoing is illustrative of various embodiments and is not to be construed as limited to the specific embodiments disclosed, and that modifications to the disclosed embodiments, as well as other embodiments, are intended to be included within the scope of the present inventive concept, as set forth in the following claims and equivalents thereof.

What is claimed is:

1. A display device comprising:
   a substrate;
   a bottom gate pattern disposed on the substrate and disposed on a same plane as a capacitor electrode pattern of a thin film transistor;
   a first active pattern disposed on the substrate and overlapping the bottom gate pattern;
   a first inorganic insulation layer covering the first active pattern;
   a first gate electrode disposed on the first inorganic insulation layer, overlapping the first active pattern, and including a first conductive material;
   an etch-delaying pattern disposed on the first inorganic insulation layer on a same plane as the first gate electrode, including a second conductive material which includes a same material as the first conductive material and a different material from the first inorganic insulation layer, and including an upper surface;
   a second inorganic insulation layer covering the upper surface of the etch-delaying pattern and an upper surface of the first inorganic insulation layer exposed by the etch-delaying pattern and the first gate electrode, and completely covering the first active pattern;
   a contact hole formed through the second inorganic insulation layer, the etch-delaying pattern and the first inorganic insulation layer; and
   a source metal pattern including a first portion that is disposed on the second inorganic insulation layer and a second portion that passes through the second inorganic insulation layer, the etch-delaying pattern, and the first inorganic insulation layer,
   wherein the contact hole does not expose the upper surface of the etch-delaying pattern, and
   wherein the thin film transistor further comprises a second gate electrode and a second active pattern disposed between the capacitor electrode pattern and the substrate.

2. The display device of claim 1, wherein the second conductive material includes a metal.

3. The display device of claim 2, wherein the second conductive material includes molybdenum.

4. The display device of claim 1, wherein the first active pattern includes silicon.

5. The display device of claim 1, wherein the first active pattern includes a metal oxide.

6. The display device of claim 1, wherein the contact hole is formed through the second inorganic insulation layer, the etch-delaying pattern and the first inorganic insulation layer using one mask pattern as an etch mask.

* * * * *